(12) United States Patent
Kuo et al.

(10) Patent No.: US 6,767,877 B2
(45) Date of Patent: Jul. 27, 2004

(54) METHOD AND SYSTEM FOR CHEMICAL INJECTION IN SILICON WAFER PROCESSING

(75) Inventors: Chang Kuo, Singapore (SG); Ismail Kashkoush, Orefield, PA (US); Nick Yialamas, Allentown, PA (US); Gregory Skibinski, Orefield, PA (US)

(73) Assignee: Akrion, LLC, Allentown, PA (US)

( * ) Notice: Subject to any disclaimer, the term of this patent is extended or adjusted under 35 U.S.C. 154(b) by 244 days.

(21) Appl. No.: 10/053,364

(22) Filed: Jan. 18, 2002

(65) Prior Publication Data

US 2002/0144713 A1 Oct. 10, 2002

Related U.S. Application Data

(60) Provisional application No. 60/282,364, filed on Apr. 6, 2001.

(51) Int. Cl.$^7$ .................................................. B08B 3/08
(52) U.S. Cl. .......................... 510/175; 510/176; 134/2; 134/3; 134/26; 134/30; 134/31; 134/95.1; 134/90.2
(58) Field of Search .............................. 134/902, 2, 26, 134/3, 95.1, 30, 37; 510/175, 176, 177

(56) References Cited

U.S. PATENT DOCUMENTS

| | | | | |
|---|---|---|---|---|
| 5,158,100 A | * | 10/1992 | Tanaka et al. | 134/105 |
| 5,996,595 A | * | 12/1999 | Olesen et al. | 134/1.3 |
| 6,021,791 A | * | 2/2000 | Dryer et al. | 134/100.1 |
| 6,170,703 B1 | | 1/2001 | Butler et al. | |

* cited by examiner

*Primary Examiner*—Gregory Webb
(74) *Attorney, Agent, or Firm*—Michael B. Fein; Brian L. Belles; Cozen O'Connor

(57) ABSTRACT

Silicon wafers are treated with chemicals during the manufacture of integrated circuits according to the method of the invnention in the apparatus of the invention which comprises a process tank for cleaning, rinsing, and/or drying silicon wafers; a first chemical supply vessel suitable for being pressurized, fluidly coupled to the process tank; a chemical flow sensor for electronically monitoring the flow rate of chemical from the first hemical supply vessel; a first chemical flow metering valve for electronically controlling the flow rate of chemical from the first chemical supply vessel; a supply of hot DI water fluidly coupled to the process tank; a hot water metering valve for electronically controlling the flow rate of hot DI water from the supply of the hot DI water; a supply of cold DI water fluidly coupled to the process tank; a cold water metering means for electronically controlling the flow rate of cold DI water from the supply of cold DI water; water flow sensor means for electronically monitoring the flow rate of DI water; means for mixing the DI water and the first chemical to produce a solution of the first chemical in water; conductivity sensor means to electronically measure the conductivity of solution of the first chemical in water; temperature sensor means to electronically measure the temperature of the solution being supplied to the process tank; and control means for automatically adjusting the precise flow rate, temperature, pressure, and chemical concentration of solution supplied to the process tank.

18 Claims, 1 Drawing Sheet

METHOD AND SYSTEM FOR CHEMICAL INJECTION IN SILICON WAFER PROCESSING

CROSS-REFERENCE TO RELATED APPLICATIONS

Benefit of Provisional Application Ser. No. 60/282,364 is claimed filed Apr. 6, 2001.

BACKGROUND OF THE INVENTION

The present invention relates to apparatus and processes for the manufacture of integrated circuits, more specifically to those used for injecting and controlling the injection of chemicals during the processes of cleaning, rinsing, and/or drying of silicon wafers.

There has been a long felt need to improve the tank design for processing of wafers used in this industry. Current injection systems commonly utilize low dose diaphragm or bellow pumps to introduce chemicals into a pressurized deionized water pipe. The temperature of the mixture is either not controlled or relies on preheating or pre-cooling of the incoming deionized water for temperature adjustment. Concentration of the mixture is either not monitored or uses a Near Infra Red Spectrometer to measure the mixture's concentration of each chemical injected with no feedback control.

There are several problems with these existing methods.

For example, low dose diaphragm pumps create discontinuity in the injection of chemicals due to the pulsing of the diaphragm, causing inaccuracies in the amount of chemical introduced into the mixture over time. Also, when chemicals with low vapor pressure are injected with low dose diaphragm pumps, bubbles can be produced during the suction stroke that can lock up the pump or cause inaccuracies in the dosing when these bubbles get trapped along the chemical lines or the pump chamber. As the pump ages, small particulates can be produced by the flexing of the diaphragm or bellow in the pump during dosing.

Existing injection systems rely on preheated or pre-cooled deionized water for temperature control. These systems lack response when temperature control over a narrow temperature range is needed on the fly during the chemical injection. Large heaters or chillers are also needed to cope with the high flow of deionized water used in the prior methods and systems.

Near Infra Red spectrometers are expensive and in current designs they are not used to provide feedback adjustment to control the amount of chemicals injected in real time. Conductivity sensors are cheaper and are sometimes used but currently there is no method available that can differentiate the amount of chemicals injected if more than one type of chemical is used.

SUMMARY OF THE INVENTION

An objective of the present invention is to produce a very consistent solution of one or more chemicals at selected concentration(s), temperature, and flow rate, for treating silicon wafers in a process tank.

Another objective of the invention is to adjust the concentration, temperature, and/or flow rate on the fly while maintaining consistency.

A further object is to provide a system which avoids the problems associated with Near Infra Red spectrometers in systems used to supply chemical solutions to silicon wafer process tanks.

These objects, and others which will become apparent from the following disclosure and the drawings, are achieved by the present invention which comprises, in one aspect, a system for use in treating of silicon wafers with chemicals during the manufacture of integrated circuits comprising a process tank for cleaning, rinsing, and/or drying silicon wafers; a first chemical supply vessel suitable for being pressurized, fluidly coupled to the process tank; a chemical flow sensor for electronically monitoring the flow rate of chemical from the first chemical supply vessel; a first chemical flow metering valve for electronically controlling the flow rate of chemical from the first chemical supply vessel; a supply of hot DI water fluidly coupled to the process tank; a hot water metering valve for electronically controlling the flow rate of hot DI water from the supply of the hot DI water; a supply of cold DI water fluidly coupled to the process tank; a cold water metering valve for electronically controlling the flow rate of cold DI water from the supply of cold DI water; a water flow sensor for electronically monitoring the flow rate of DI water; a system for mixing the DI water and the first chemical to produce a solution of the first chemical in water; a conductivity sensor to electronically measure the conductivity of solution of the first chemical in water; a temperature sensor to electronically measure the temperature of the solution being supplied to the process tank; and a control system for automatically adjusting the precise flow rate, temperature, and chemical concentration of solution supplied to the process tank.

In another aspect, the invention comprises method of injecting a solution of one or more chemicals in DI water into a process tank for cleaning, rinsing, and/or drying silicon wafers comprising pressurizing one or more chemical supply vessels fluidly coupled to the process tank; monitoring and controlling the flow rate of each chemical from each supply vessel; controlling the flow rate of hot DI water from a supply thereof; controlling the flow rate of cold DI water from a supply thereof, monitoring the flow rate of hot DI water from the supply thereof, cold DI water from the supply thereof, and/or a mixture of combined hot and cold DI water; mixing the hot and the cold DI water; mixing the first chemical with the mixture of the hot and the cold DI water and measuring the conductivity of the resultant solution of the first chemical in DI water; measuring the temperature of the solution of first chemical and any additional chemical(s) in DI water; and controlling the precise flow rate, temperature, and chemical concentration of the first and any additional chemicals in the solution supplied to the process tank.

The system for mixing the DI water and chemicals is preferably a chemical injection valve and a static mixer.

The water flow sensor system is either a total water flow sensor which measures the combined hot and cold DI water before it is combined with the first chemical, or it is separate water flow sensors for the hot and cold DI water before they are combined with each other and subsequently combined with the first and then any additional chemical(s).

In the preferred system, there are two chemical supply vessels, one for the first chemical and one for a second chemical, with the chemical flow from each vessel monitored with a flow sensor and metered with a metering valve. In systems having three or more chemical supply vessels, the chemical flow from each one is monitored and controlled in the same manner.

Nitrogen, preferably ultra pure nitrogen, is supplied under pressure to each chemical supply vessel to pressurize the vessel(s). Chemical can be supplied to the chemical supply vessel(s) from source(s) of bulk chemical(s) in conventional manners using conventional apparatus.

The controller can be a conventional programmed processor, although the programming is specific to the system of the invention. By continuously comparing the temperature of the solution supplied to the process tank with the desired, selected temperature, the controller is programmed to cause the proportion or ration of flow rate of hot DI water to cold DI water to be adjusted to achieve the desired temperature. The concentrations of the first and any second or additional chemicals are continuously controlled by the controller by monitoring the concentration of the first chemical in the solution. In the preferred system where there are two chemicals in the solution, the concentration of the solution of the first chemical and the concentration of the combined first and second chemicals are both used to determine the concentration of the second chemical. The flow rates of the first and second chemicals and the hot and cold DI water are continuously adjusted by the controller in order to provide very accurate concentrations of chemicals at the precise desired temperature.

The chemical supply vessel(s) and sources of DI water are fluidly connected, ultimately to the process tank, preferably using conventional piping or tubes.

DETAILED DESCRIPTION

Figure 1:
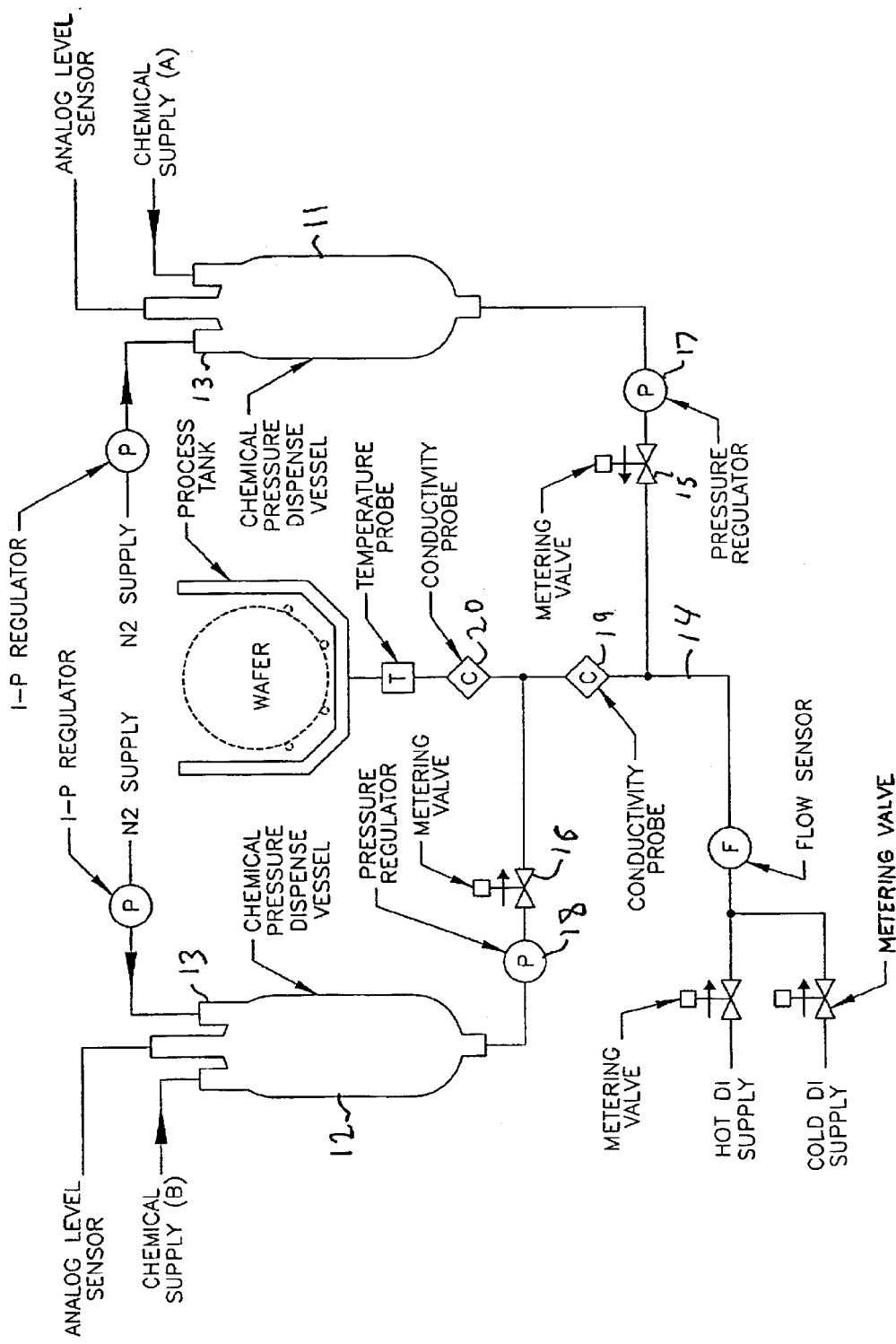
FIG. 1 illustrates a basic plumbing and instrumentation diagram of injection system of the invention.

Referring to FIG. 1, the desired type of chemicals are contained in separate pressure rated vessels. In the illustrated embodiment HF is contained in vessel 11 and HCl is contained in vessel 12. The vessels are pressurized by introducing ultra pure nitrogen into the top portion of the vessels 13. The chemicals are injected into a tube 14 carrying deionized water via a series of chemical valves 15 and 16. This method cuts back on discontinuity when the chemicals are injected. The pressure from the nitrogen also cuts down on bubble formation when low vapor pressure chemicals are used. The minimal use of moving parts in the injection system cuts down on particle generation when compared to the use of a conventional dosing pump.

The pressure and flow rate of the chemicals are adjusted by an electronically controlled pressure regulators 17 and 18, and a metering valve 15 and 16, respectively. The regulators 17 and 18 and metering valves 15 and 16 are adjusted automatically to maintain the desired flow rate of the chemicals to be injected.

Mixing hot and cold deionized water and adjusting their flow rates accordingly achieve the desired temperature of the mixture is done automatically by monitoring both the temperature of the mixture and flow rates of the hot and cold deionized water.

Conductivity sensors 19 and 20 are used to monitor and feedback information on the concentration of each chemical component in the mixture. One conductivity sensor is used after each chemical injection point. The chemical with the lower conductivity, HF in the illustrated example, is injected first, and is referred to as the first chemical herein, followed the next chemical with a higher conductivity, referred to as the second chemical, HCl in the illustrated example. The first sensor 19 picks up the conductivity level of the solution of the first chemical in the water, and the second sensor detects the total conductivity of the solution of the first and second chemicals in the water. By characterizing the differences in conductivity caused by different amounts of first and second chemicals, the amount of each component in the mixture can be determined by the processor.

The amount of each type of chemical to inject at any given time is determined by closely monitoring the flow rates of both the injected chemical and the incoming deionized water.

The concentration information from the series of conductivity sensors is compared with the desired chemical concentration. The difference between desired and actual concentration is used to trigger corrections in the flow rates of the injected chemical and the incoming deionized water via its respective metering valves.

This process is repeated until the difference between the desired and actual concentration of the mixture is reduced to an acceptable level, which in the illustrated example is ±0.1% by weight.

There are two alternative preferred embodiments for mixing the hot and cold deionized water to meet temperature and total deionized water flow rate targets.

The first embodiment is illustrated in FIG. 1. The measured temperature of the hot and cold deionized water mixture is compared with the desired temperature. The difference between the actual and desired temperature is used to calculate the correction in the proportion of hot and cold deionized water needed to arrive at the desired temperature. These adjustments are translated to signals to the hot and cold metering valves that will lower or increase the deionized water flow rates in proportion. Since altering the hot to cold flow rate proportion makes these adjustments in flow rates, the desired total deionized water flow rate will be maintained.

This sequence of correction is repeated till the difference in the desired and actual temperature is reduced to an acceptable level.

In an alternative embodiment, only one temperature sensor and flow sensor is used, located after the hot and cold deionized water are mixed together.

The cold deionized water metering valve will open and make adjustments till the total flow rate reaches the desired value or to within a tolerable limit. During this time no hot deionized water will be introduced. Actual total flow rate values from the flow sensor will be used strictly to control only the cold deionized water metering valve.

The actual (reading from the temperature sensor) and desired temperature values will be compared. This difference will be used to trigger the hot deionized water metering valve to open up and mix with the cold deionized water raising its temperature. Again the temperature sensor here will be used strictly to control the opening and closing of the hot deionized water metering valve. The amount of hot water to introduce will correspond to the temperature difference calculated in the earlier step. Increasing the hot deionized water at the same time will also raise the total flow rate reading picked up by the flow sensor. This increase in the actual total deionized water flow rate will in turn create a difference in the actual and desired flow rate values, triggering a response from the cold deionized water metering valve to reduce the amount of cold deionized water.

These adjustments to the independently controlled hot and cold deionized water metering valves are repeated in the same manner till both the desired temperature and total deionized flow rate is reached.

While the invention has been described and illustrated in detail, various alternative embodiments and modifications should become readily apparent to those skilled in the art without departing from the spirit and scope of the invention.

What is claimed is:

1. A system for use in treating of silicon wafers with chemicals during the manufacture of integrated circuits comprising:

a process tank for cleaning, rinsing, and/or drying silicon wafers;

a first chemical supply vessel suitable for being pressurized, fluidly coupled to the process tank;

a chemical flow sensor for electronically monitoring the flow rate of chemical from the first chemical supply vessel;

a first chemical flow metering valve for electronically controlling the flow rate of chemical from the first chemical supply vessel;

a supply of hot DI water fluidly coupled to the process tank;

a hot water metering valve for electronically controlling the flow rate of hot DI water from the supply of the hot DI water;

a supply of cold DI water fluidly coupled to the process tank;

a cold water metering means for electronically controlling the flow rate of cold DI water from the supply of cold DI water;

water flow sensor means for electronically monitoring the flow rate of DI water;

means for mixing the DI water and the first chemical to produce a solution of the first chemical in water;

conductivity sensor means to electronically measure the conductivity of solution of the first chemical in water;

temperature sensor means to electronically measure the temperature of the solution being supplied to the process tank; and control means for automatically adjusting the precise flow rate, temperature, pressure, and chemical concentration of solution supplied to the process tank.

2. The apparatus of claim 1 wherein the means for mixing the DI water and the first chemical comprise a chemical injection valve and a static mixer.

3. The apparatus of claim 1 wherein the water flow sensor means is a total water flow sensor which is positioned to measure the flow of the combined hot DI water and cold DI water.

4. The apparatus of claim 1 wherein the water flow sensor means comprises a hot DI water flow sensor and a cold DI water flow sensor.

5. The apparatus of claim 1 further including a second chemical supply vessel suitable for being pressurized and fluidly coupled to the process tank, a second chemical flow sensor for electronically monitoring the flow rate of chemical from the second chemical supply vessel, and a second chemical flow metering valve for electronically controlling the flow rate of chemical from the second chemical supply vessel, means for mixing the second chemical with the solution of the first chemical in water, and a second conductivity sensor to electronically measure the conductivity of the solution of first and second chemical in water.

6. The apparatus of claim 5 further including a supply of nitrogen fluidly coupled to the first chemical supply vessel so as to pressurize the first chemical supply vessel and a supply of nitrogen fluidly coupled to the second chemical supply vessel so as to pressure the second chemical supply vessel.

7. The apparatus of claim 1 further including a supply of nitrogen fluidly coupled to the first chemical supply vessel so as to pressurize the first chemical supply vessel.

8. The apparatus of claim 1 further including a source of supply of first chemical to the first chemical supply vessel.

9. The apparatus of claim 1 wherein the control means is a programmed processor.

10. A method of injecting a solution of one or more chemicals in DI water into a process tank for cleaning, rinsing, and/or drying silicon wafers comprising:

pressurizing one or more chemical supply vessels fluidly coupled to the process tank;

monitoring and controlling the flow rate of each chemical from each supply vessel;

controlling the flow rate of hot DI water from a supply thereof;

controlling the flow rate of cold DI water from a supply thereof;

monitoring the flow rate of hot DI water from the supply thereof, cold DI water from the supply thereof, and/or a mixture of combined hot and cold DI water;

mixing the hot and the cold DI water;

mixing the first chemical with the mixture of the hot and the cold DI water and measuring the conductivity of the resultant solution of the first chemical in DI water;

measuring the temperature of the solution of first chemical and any additional chemical(s) in DI water; and controlling the precise flow rate, temperature, pressure, and chemical concentration of the first and any additional chemicals in the solution supplied to the process tank.

11. The method of claim 10, further including mixing a second chemical with the solution of the first chemical in DI water and measuring the conductivity of the resultant solution of first and second chemical.

12. The method of claim 10, further including mixing a third chemical with the solution of the first and second chemical in water and measuring the conductivity of the resultant solution of first, second, and third chemicals in water.

13. The method of claim 10 wherein the chemical supply vessels are pressurized with nitrogen.

14. The method of claim 10 wherein a selected temperature of solution supplied to the process tank is obtained by continuously comparing the temperature of the solution being supplied to the process tank and adjusting the proportion of flow rate of hot DI water to cold DI water to achieve the desired temperature.

15. The method of claim 10 wherein a desired concentration of first chemical is achieved by adjusting the flow rate of the first chemical based on the conductivity of the solution of the first chemical in water.

16. The method of claim 10 wherein a desired concentration of first chemical is achieved by adjusting the flow rate of the first chemical based on the conductivity of the solution of the first chemical in water and the desired concentration of second chemical is achieved by adjusting the flow rate of the second chemical based on the conductivity of the solution of the first chemical and the conductivity of the solution of the first and second chemical.

17. The method of claim 10 wherein the first chemical is HF, and the additional chemicals comprise a second chemical which is HCl.

18. The method of claim 10 wherein the first chemical is HF, and the additional chemicals comprise a second chemical which is HCl, and a third chemical which is $H_2O_2$.

* * * * *